(12) United States Patent  
Chen

(10) Patent No.: US 11,251,372 B2
(45) Date of Patent: Feb. 15, 2022

(54) VAPOR DEPOSITION SOURCE AND METHOD FOR MAKING ORGANIC LIGHT-EMITTING DIODE DISPLAY PANEL

(71) Applicant: HON HAI PRECISION INDUSTRY CO., LTD., New Taipei (TW)

(72) Inventor: Ying-Chieh Chen, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 340 days.

(21) Appl. No.: 16/231,534

(22) Filed: Dec. 23, 2018

(65) Prior Publication Data

US 2019/0214562 A1 Jul. 11, 2019

Related U.S. Application Data

(60) Provisional application No. 62/615,023, filed on Jan. 9, 2018.

(51) Int. Cl.
| | |
|---|---|
| *H01L 51/56* | (2006.01) |
| *C23C 14/24* | (2006.01) |
| *H01L 51/00* | (2006.01) |
| *H01L 51/50* | (2006.01) |
| *H01L 27/32* | (2006.01) |

(52) U.S. Cl.
CPC ............ *H01L 51/001* (2013.01); *C23C 14/24* (2013.01); *H01L 27/32* (2013.01); *H01L 51/0002* (2013.01); *H01L 51/5012* (2013.01); *H01L 51/56* (2013.01); *H01L 2227/32* (2013.01)

(58) Field of Classification Search
CPC .... C23C 14/0021–0031; C23C 14/228; C23C 14/24–325; H01L 51/0002–0013
See application file for complete search history.

(56) References Cited

U.S. PATENT DOCUMENTS

| | | | |
|---|---|---|---|
| 2011/0104398 A1 | 5/2011 | Korevaar et al. | |
| 2013/0267055 A1 | 10/2013 | Ro et al. | |
| 2013/0276701 A1 | 10/2013 | Sonoda et al. | |
| 2016/0122866 A1 | 5/2016 | Tung et al. | |
| 2017/0092860 A1* | 3/2017 | Jia ..................... C23C 16/45574 |

FOREIGN PATENT DOCUMENTS

| | | |
|---|---|---|
| CN | 103270187 A | 8/2013 |
| CN | 102051599 B | 4/2015 |
| CN | 106119779 A | 11/2016 |
| KR | 10-2009-0074595 A | 7/2009 |
| TW | I582251 B | 5/2017 |

* cited by examiner

*Primary Examiner* — Daniel P Shook
(74) *Attorney, Agent, or Firm* — ScienBiziP, P.C.

(57) ABSTRACT

A source to facilitate precise vapor deposition in processes to obtain organic light emitting diodes (OLEDs) in a display panel, includes forming a plurality of grooves on a first substrate; in filling organic light emitting materials into the grooves and providing a second substrate to receive the vaporized organic light emitting materials. The first substrate is aligned with the second substrate and the first substrate is heated to vaporize the organic light emitting materials in the grooves. The vapor deposition regions of the second substrate form an organic light emitting material layer after the deposition, the layer can then be used in an OLED display panel. The shadow effect is greatly reduced, a method for the procedure is also disclosed.

12 Claims, 11 Drawing Sheets

US 11,251,372 B2

VAPOR DEPOSITION SOURCE AND METHOD FOR MAKING ORGANIC LIGHT-EMITTING DIODE DISPLAY PANEL

FIELD

The subject matter herein generally relates to organic light emitting diode (OLED) manufacture.

BACKGROUND

Organic Light-Emitting Diode (OLED) displays permit wide color gamut. OLEDs are light weight, and consumer little power. An OLED display does not use a backlight as a light source but an organic light-emitting material located on a glass substrate of the OLED display. Generally, the light-emitting material layer is formed by vapor deposition. However, a vapor deposition angle of a vapor deposition source may be too small or too large, resulting in shadow effects or uneven film thickness.

Therefore, there is room for improvement in the art.

BRIEF DESCRIPTION OF THE DRAWINGS

Implementations of the present technology will now be described, by way of embodiment, with reference to the attached figures.

DETAILED DESCRIPTION

Figure 1:
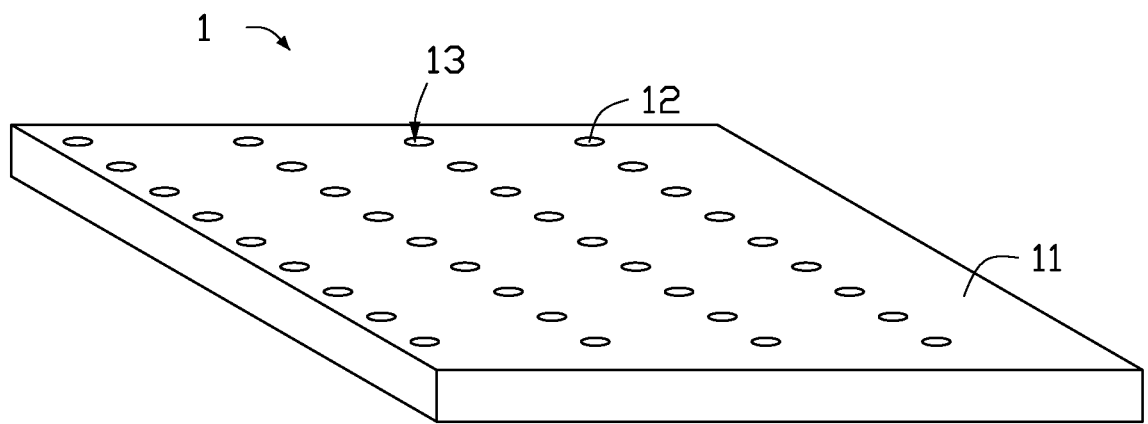
FIG. 1 is a perspective view of a vapor deposition source according to a first embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "coupled" is defined as connected, whether directly or indirectly through intervening components, and is not necessarily limited to physical connections. The connection can be such that the objects are permanently connected or releasably connected. The term "comprising" when utilized, means "including, but not necessarily limited to"; it specifically indicates open-ended inclusion or membership in the so-described combination, group, series, and the like.

As shown in FIG. 1, a vapor deposition source 1 according to a first embodiment of present disclosure comprises a first substrate 11. The first substrate 11 is a flat plate, the first substrate 11 is made of a heatable material which can conduct heat. In an embodiment, the first substrate 11 may be one of a glass substrate, a quartz substrate, a silicon substrate, or a plastic substrate.

As shown in FIG. 1, a plurality of grooves 12 are provided on a surface of the first substrate 11 and spaced apart from each other. In this embodiment, each of the grooves 12 is a circular dot-shaped groove. In other embodiments, each of the grooves 12 may be a square, rhombic, triangular, or other shape. The number and positions of the grooves 12 can be set according to the required structure of organic light-emitting layers of pixels of the OLED display. In the embodiment, the grooves 12 are evenly distributed on the first substrate 11.

Each groove contains vapor deposition material 13. Each groove 12 may contain same weight of vapor deposition material. It can be understood that the weight of the vapor deposition material 13 in each groove 12 may vary depending on the design of the structure and number of grooves 12. For example, when the area of blue organic light-emitting layer is to be larger than the area of red/green organic light-emitting material layer, the vapor deposition source 1 may comprise a plurality of grooves 12 containing blue-light vapor deposition material and a plurality of grooves 12 containing vapor deposition material of other colors, and a weight of the vapor deposition material 13 in the groove 12 containing blue-light vapor deposition material is heavier than a weight of the vapor deposition material 13 in the groove 12 containing vapor deposition material of other colors.

It can be understood that, when designing the vapor deposition source 1, in addition to adjust the weight of the vapor deposition material 13 in the grooves 12, the depth, area, and other feature of the grooves 12 can also be adjusted.

Figure 2:
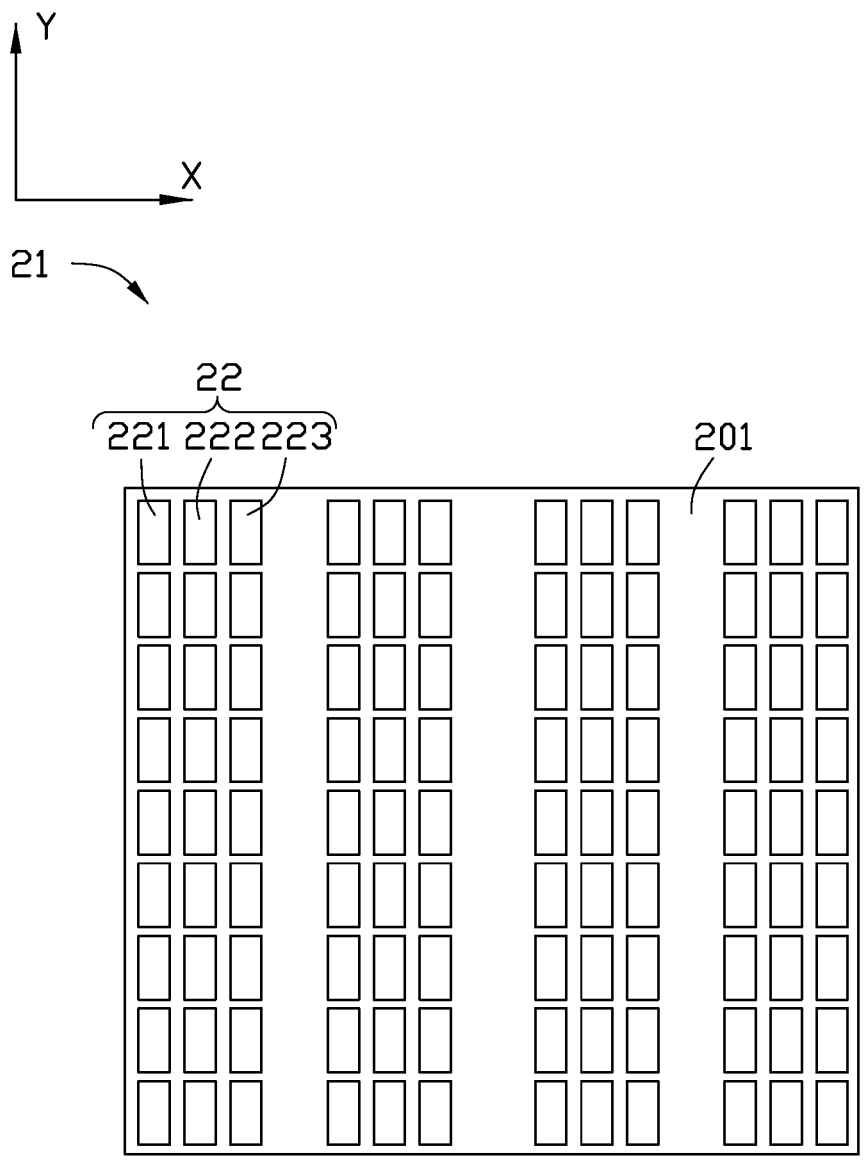
FIG. 2 is a planar view of a second substrate for carrying a vapor deposition material according to the first embodiment of the present disclosure.

FIG. 2 shows a second substrate 21 for carrying a vapor deposition material according to the first embodiment of the present disclosure. The second substrate 21 comprises a first surface 201, and the first surface 201 defines a plurality of pre-vapor deposition regions 22. The pre-vapor deposition regions 22 receives the vapor deposition material 13 in vaporized form, and then cooling the vapor deposition material 13 in vaporized form. That is, the vapor deposition material 13 may be formed on the pre-vapor deposition region 22 of the first surface 201 of the second substrate 21 after vapor deposition.

In this embodiment, each pre-vapor deposition region 22 comprises at least one first pre-vapor deposition sub-region 221, at least one second pre-vapor deposition sub-region 222, and at least one third pre-vapor deposition sub-region 223. That is, the second substrate 21 includes a plurality of first pre-vapor deposition sub-regions 221, a plurality of second pre-vapor deposition sub-regions 222, and a plurality of third pre-vapor deposition sub-regions 223.

After different vapor deposition processes, different vapor deposition materials 13 may be formed on each first pre-vapor deposition sub-region 221, each second pre-vapor deposition sub-region 222, and each pre-vapor deposition sub-region 223 respectively.

As shown in FIG. 2, the plurality of pre-vapor deposition regions 22 are arranged in rows and columns in a matrix on the second substrate 21. The first pre-vapor deposition sub-region 221, the second pre-vapor deposition sub-region 222, and the third pre-vapor deposition sub-region 223 of each pre-vapor deposition region 22 are arranged sequentially in rows (an X direction as shown in FIG. 2).

The plurality of first pre-vapor deposition sub-regions 221 are arranged in a columnar direction (a Y direction as shown in FIG. 2) to form a plurality of columns of the first pre-vapor deposition sub-regions 221. The plurality of second pre-vapor deposition sub-regions 222 are also arranged in the columnar direction (the Y direction shown in FIG. 2) to form a plurality of columns of the second pre-vapor deposition sub-regions 222. The plurality of third pre-vapor deposition sub-regions 223 are also arranged in the columnar direction (the Y direction shown in FIG. 2) to form a plurality of columns of the third pre-vapor deposition sub-regions 223.

Each pre-vapor deposition sub-region 22 is to be a pixel region of the OLED display, and each pre-vapor deposition sub-region 22 will receive organic light-emitting material of a predetermined light-color. The first pre-vapor deposition sub-region 221, the second pre-vapor deposition sub-region 222, and the second pre-vapor deposition sub-region 223 respectively correspond to pixel regions of different light-colors. The pre-vapor deposition sub-regions 22 located in the same column correspond to pixel regions of the same light-color.

In this embodiment, the vapor deposition material 13 is organic light-emitting material. After the first substrate 11 is aligned with the second substrate 21, the plurality of grooves 12 on the first substrate 11 correspond to the plurality of first pre-vapor deposition regions 221 on the second substrate 21. The projections of the grooves 12 on the first substrate 11 overlap with the first pre-vapor-deposition regions 221. The organic light-emitting material of a first light-color in the grooves 12 can be vapor deposited on the plurality of first pre-vapor deposition regions 221 at an incident angle of approximately 90° or equal to 90° to form an organic light-emitting material layer of the first color.

It can be understood that after forming the organic light emitting material layer of the first color, a first substrate 11 including a plurality of grooves 12 containing organic light-emitting material of a second light-color may be provided. In an embodiment, after the first substrate 11 is aligned with the second substrate 21, the plurality of grooves 12 on the first substrate 11 correspond to the plurality of second pre-vapor deposition regions 222. The projections of the grooves 12 on the first substrate 11 overlap with the second pre-vapor-deposition regions 222 on the second substrate 21. The organic light-emitting material of the second color in the grooves 12 can be vapor deposited on the plurality of second pre-vapor deposition regions 222 at an incident angle of approximately 90° or equal to 90° to form an organic light-emitting material layer of the second color. Furthermore, after forming the organic light-emitting material layer of the second color, another first substrate 11 including a plurality of grooves 12 containing organic light emitting material of a third light-color may be provided. In an embodiment, after the first substrate 11 is aligned with the second substrate 21, the plurality of grooves 12 on the first substrate 11 correspond to the plurality of third pre-vapor deposition regions 223 on the second substrate 21. The projections of the grooves 12 on the first substrate 11 overlap with the third pre-vapor-deposition regions 223 on the second substrate 21. The organic light-emitting material of the third color in the grooves 12 can be vapor deposited on the plurality of third pre-vapor deposition regions 223 at an incident angle of approximately 90° or equal to 90° to form an organic light-emitting material layer of the third color.

In this embodiment, when forming the organic light-emitting material layers of different light-colors, different vapor deposition sources 1 containing the organic light-emitting material of different light-colors may be used. However, it can be understood that, in an embodiment, one vapor deposition source 1 can be used at a time during several processes to form organic light-emitting material layers of different light-colors. When the organic light-emitting material of the first light-color in the vapor deposition source 1 needs to be changed to the organic light-emitting material of the second light-color, the grooves 12 may be cleaned to remove the organic light-emitting material of the first light-color remaining.

Figure 3:
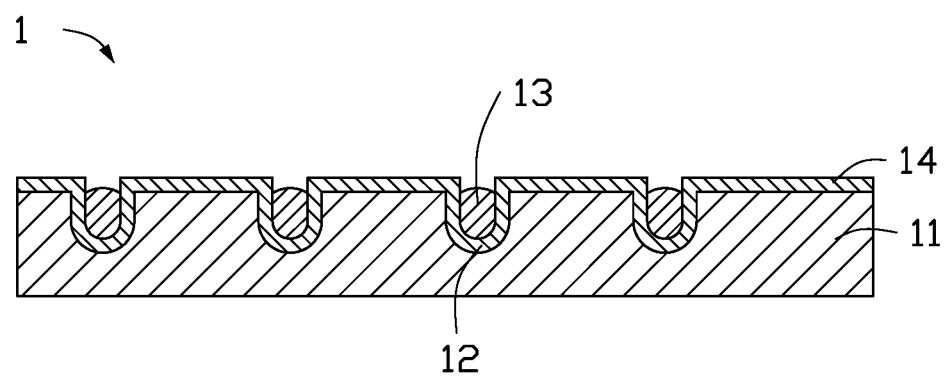
FIG. 3 is a cross-sectional view of a vapor deposition source according to another embodiment of the present disclosure.

As shown in FIG. 3, in an embodiment, when one vapor deposition source 1 is used to form the organic light-emitting material layers of different light-colors, in order to prevent the light-emitting material remaining in the groove 12, a peelable layer 14 covering inner surfaces of the grooves 12 may be provided. The peelable layer 14 may also cover a surface of the first substrate on which the grooves 12 are formed. The peelable layer 14 can be easily separated from the first substrate 11. After the organic light-emitting material of the first light-color is vapor deposited, the peelable layer 14 may be peeled off, and another peelable layer 14 may be formed before depositing organic light-emitting material of the different light-color. The method of peeling off the peelable layer 14 may be physical or chemical. For example, the peelable layer 14 may be a photoresist material that can be removed by an ashing process, or may be an organic material layer that can be easily dissolved in a solvent.

In the following embodiments, elements having the same or similar functions as those of the first embodiment are described by the same reference numerals.

Figure 4:
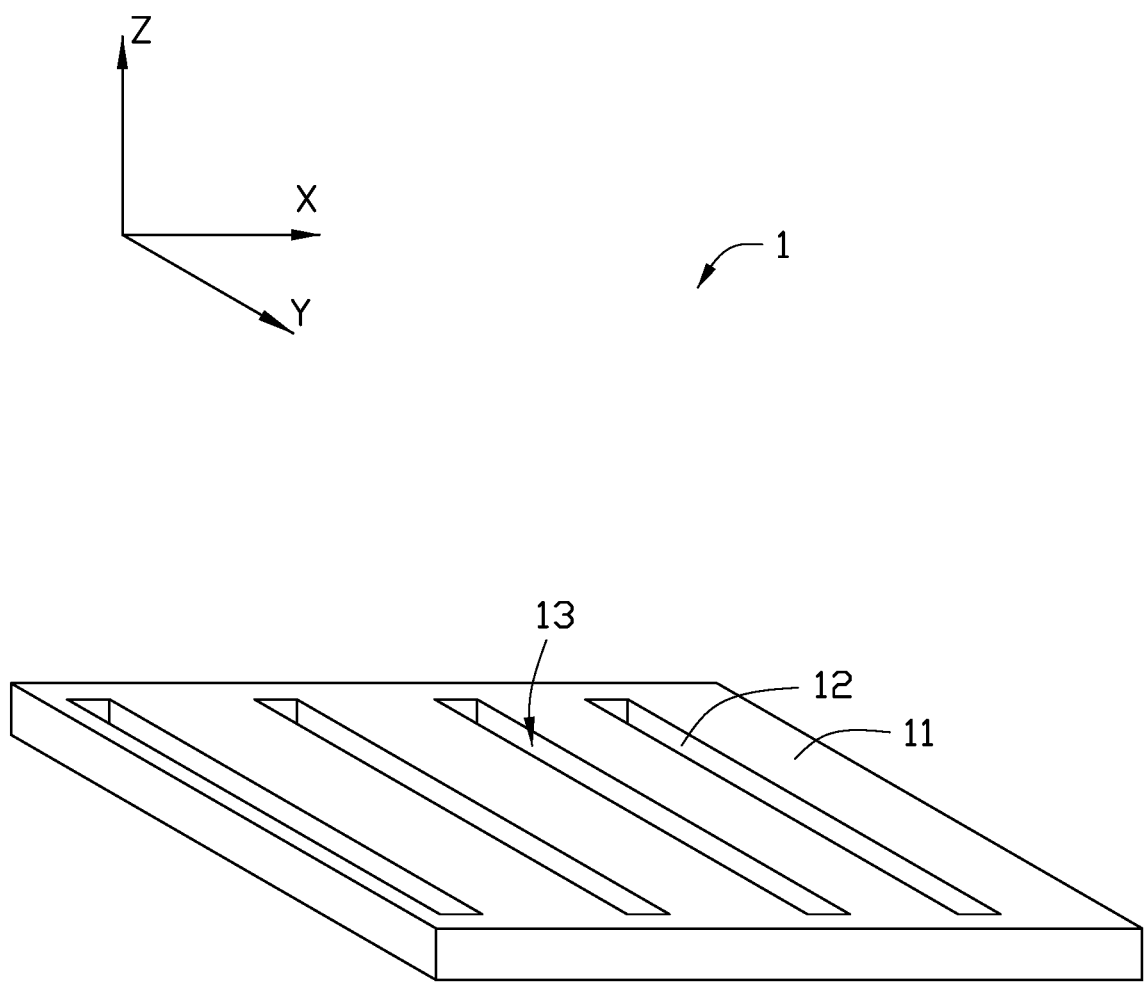
FIG. 4 is a perspective view of a vapor deposition source according to a second embodiment of the present disclosure.

As shown in FIG. 4, the vapor deposition source 1 of a second embodiment comprises a first substrate 11. A plurality of grooves 12 are provided on a surface of the first substrate 11 and spaced from each other. The plurality of grooves contain the vapor deposition material 13. In this embodiment, the plurality of grooves 12 are linear grooves in straight lines. In other embodiments, the grooves 12 may also be linear grooves in curved lines or broken lines. In this embodiment, the grooves 12 may be parallel to each other.

In this embodiment, after the first substrate 11 is aligned with the second substrate 21, each of the grooves 12 extending in a Y direction as in FIG. 4 corresponds to a column of the plurality of first pre-vapor deposition regions 221. That is, a projection of each of the grooves 12 extending in the Y direction on the first substrate 11 overlaps with a column of first pre-vapor deposition regions 221. The grooves 12 contain vapor deposition materials 13. The vapor deposition materials 13 may be formed in the first pre-vapor deposition regions 221 after the vapor deposition process. In this embodiment, an organic light-emitting materials of the first color in the grooves 12 can be vapor deposited on the first pre-vapor deposition regions 221 at an incident angle of approximately 90° or equal to 90° to form an organic light-emitting material layer of the first color.

It can be understood that after forming the organic light emitting material layer of the first light-color, a first substrate 11 including a plurality of grooves 12 containing organic light emitting materials of the second color may be provided. In an embodiment, after the first substrate 11 is aligned with the second substrate 21, the plurality of grooves 12 on the first substrate 11 corresponds to the second pre-vapor deposition regions 222. The projections of the grooves 12 on the first substrate 11 overlap with the second pre-vapor-deposition regions 222. The organic light-emitting materials of the first color in the grooves 12 can be vapor deposited to the plurality of second pre-vapor deposition regions 222 at an incident angle of approximately 90° or equal to 90° to form an organic light-emitting material layer of the second light-color. Furthermore, after forming the organic light emitting material layer of the second light-color, another first substrate 11 including grooves 12 containing organic light emitting materials of the third light-color may be provided. In an embodiment, after the first substrate 11 is aligned with the second substrate 21, the plurality of grooves 12 on the first substrate 11 correspond to the plurality of third pre-vapor deposition regions 223 on the second substrate 21. The projections of the grooves 12 on the first substrate 11 overlap with the third pre-vapor-deposition regions 223. The organic light-emitting materials of the third first color in the grooves 12 can be vapor deposited to the plurality of third pre-vapor deposition regions 223 at an incident angle of approximately 90° or equal to 90° to form an organic light-emitting material layer of the third light-color.

Figure 5:
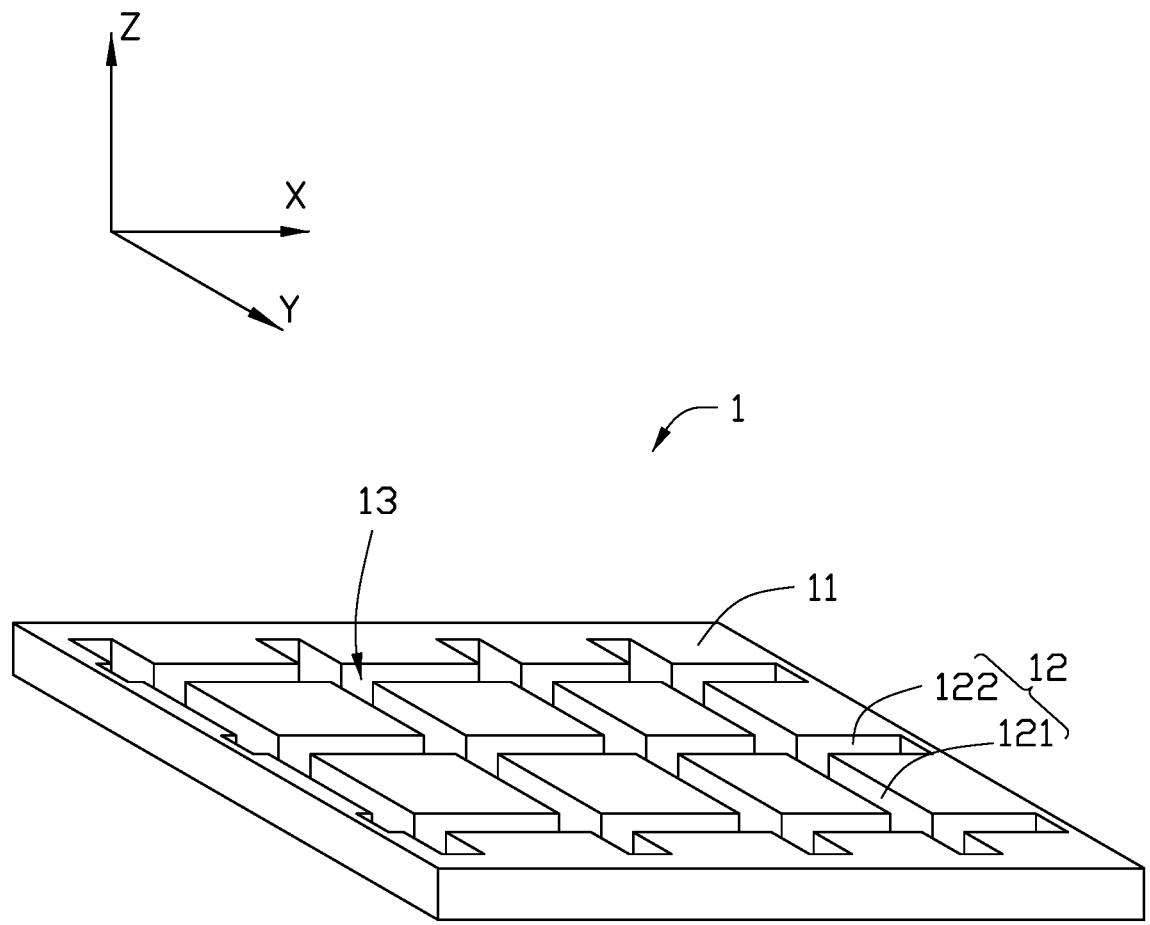
FIG. 5 is a perspective view of a vapor deposition source according to a third embodiment of the present disclosure.

As shown in FIG. 5, the vapor deposition source 1 of a third embodiment comprises a first substrate 11. Grooves 12 are provided on a surface of the first substrate 11 and are spaced from each other. The grooves 12 contain vapor deposition material 13. In this embodiment, the grooves 12 comprises a plurality of first grooves 121 extending in a Y direction in FIG. 5 and a plurality of second grooves 122 extending in a X direction in FIG. 5. The first grooves 121 and the second grooves 122 intersect with each other to form a matrix. In this embodiment, a projection of the first grooves 121 and the second grooves 122 on the first substrate 11 forms a mesh pattern.

In this embodiment, after the first substrate 11 is aligned with the second substrate 21, each of the grooves 12 extending in the Y direction in FIG. 5 corresponds to a column of a plurality of first pre-vapor deposition regions 221. That is, a projection of each of the grooves 12 extending in the Y direction in FIG. 5 on the first substrate 11 overlaps with the plurality of first pre-vapor deposition regions 221. The grooves 12 contain vapor deposition materials 13. The vapor deposition materials 13 may be formed in the plurality of first pre-vapor deposition regions 221 after the vapor deposition.

The grooves 12 of the vapor deposition source 1 in above embodiments are located to correspond to the pre-vapor deposition regions 22 when in the vapor deposition, so that the vapor deposition materials 13 in the grooves 12 can be vapor deposited to the second substrate 21 at an incident angle of approximately 90° or equal to 90° to form an organic light-emitting material layer. This effectively reduces the shadow effect or uneven film thickness.

Figure 6:
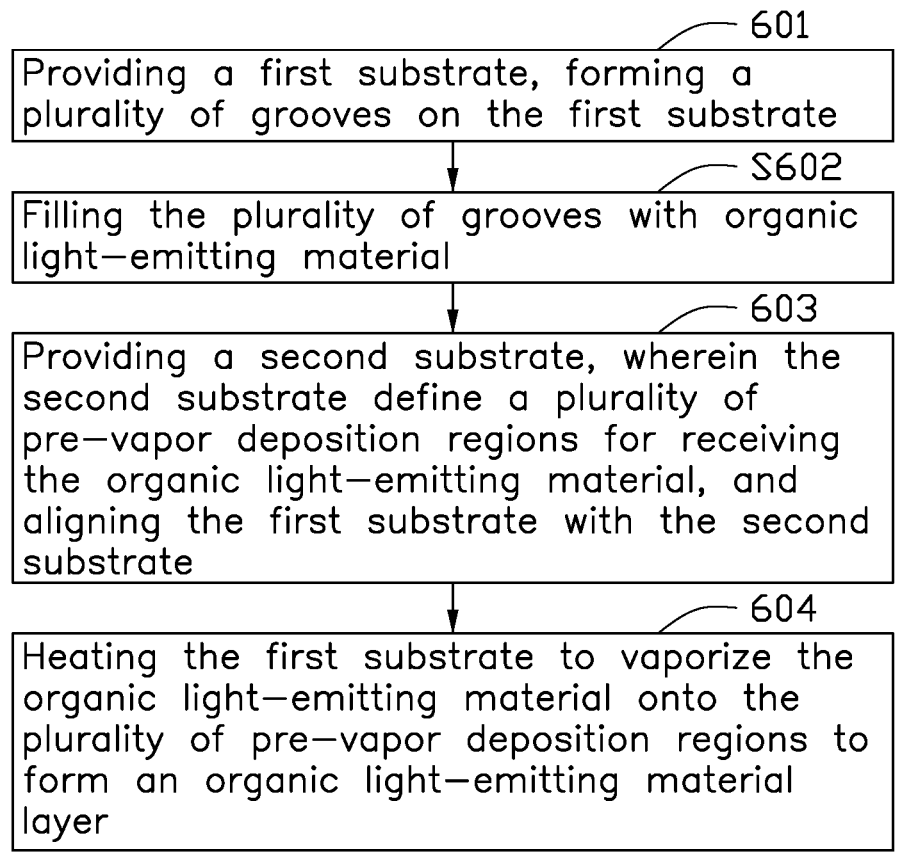
FIG. 6 is a flowchart of a method for manufacturing an OLED display panel according to the first embodiment of the present disclosure.
Figure 7:
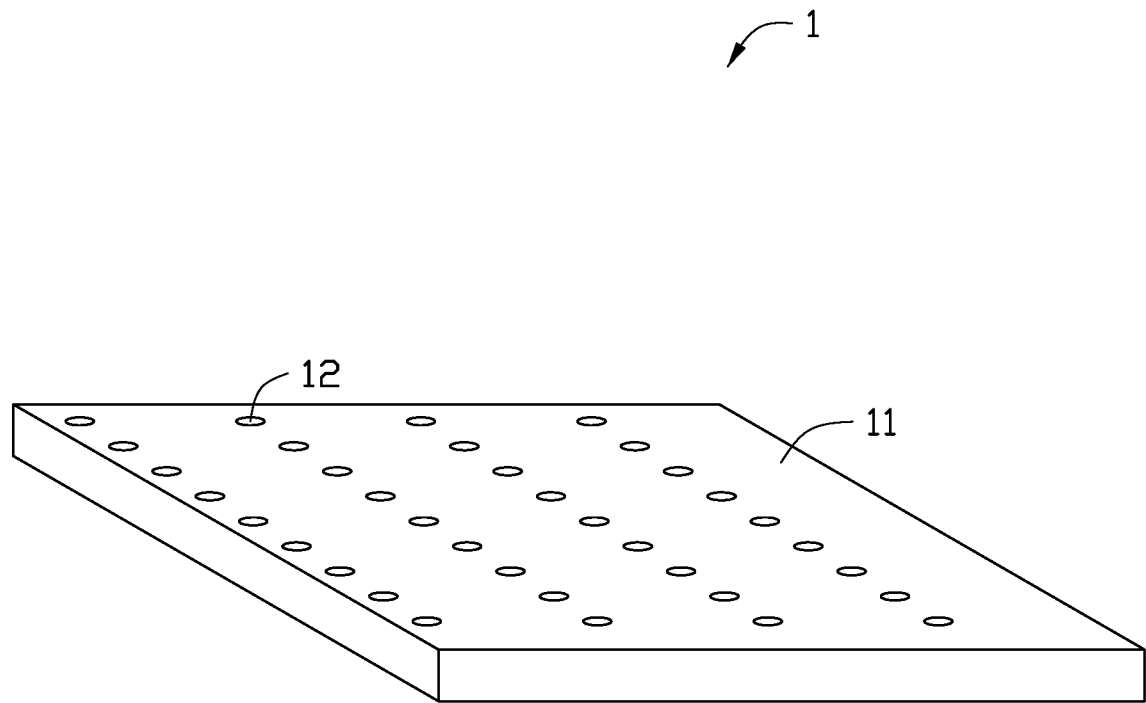
FIG. 7 through FIG. 10 are perspective views showing a method for manufacturing the OLED display panel according to the first embodiment of the present disclosure.

As shown in FIG. 6, a method for manufacturing an OLED display panel according to the first embodiment comprises:

Step S601: as shown in FIG. 7, a first substrate 11 is provided, a plurality of grooves 12 are formed on the first substrate 11.

The first substrate 11 is made of a heatable and heat-conducting material. Each of the grooves 12 may be one of a circular, square, rhombic, triangular or other shapes. In this embodiment, the grooves 12 are circular dot-shaped grooves.

The grooves 12 may be etched by laser etching or by a suitable etching method such as by liquid etching.

Figure 8:
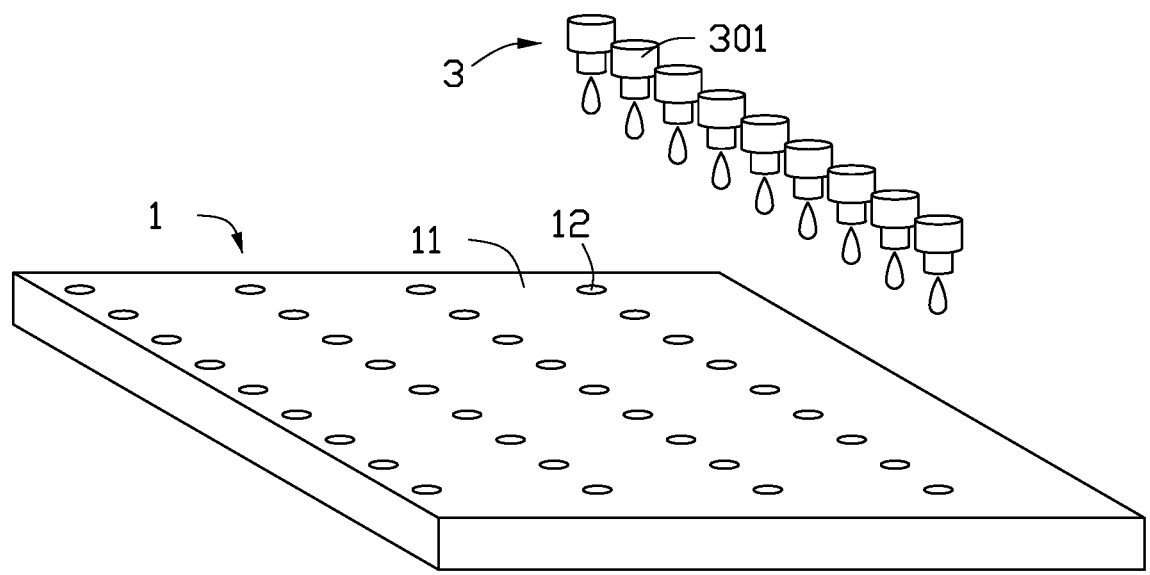

Step S602, as shown in FIG. 8, vapor deposition material 13 is put in the grooves 12 to form a vapor deposition source 1.

In this embodiment, the vapor deposition material 13 is organic light-emitting material.

In this embodiment, a spraying tool 3 containing vapor deposition material 13 is provided. The spraying tool 3 includes a plurality of nozzles 31, and each nozzle can be precisely aligned with one of the grooves 12, and inject the vapor deposition material 13 into each of the grooves 12.

In this embodiment, the spraying tool 3 can set up according to the required area and thickness of the organic light-emitting material layer, and precisely align the groove 12 through the nozzle 31, and inject an appropriate amount of the vapor deposition material 13 into the groove 12.

Figure 9:
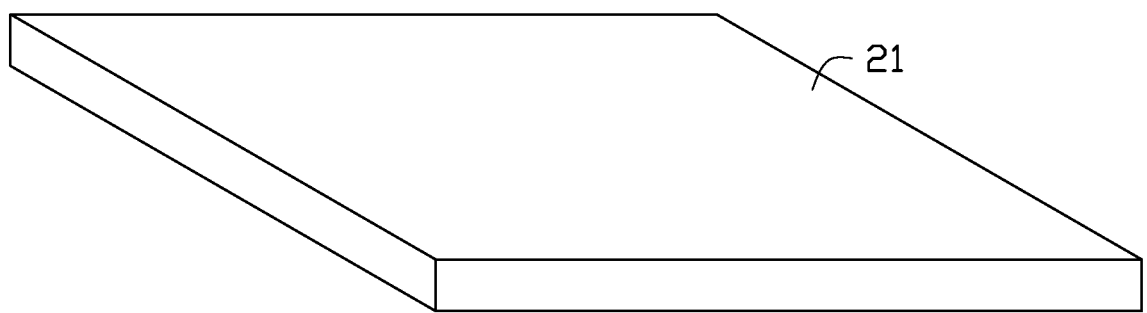
Figure 9:
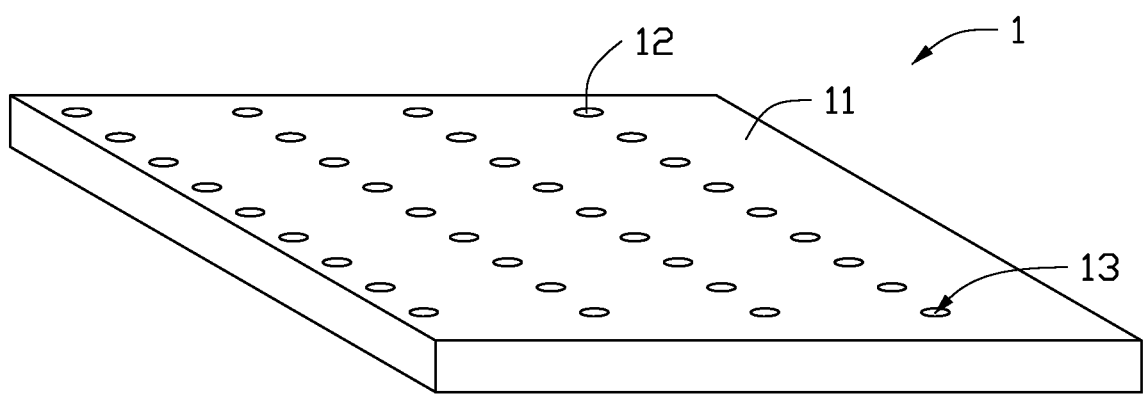

Step S603, as shown in FIG. 9, a second substrate 21 is provided as a substrate for carrying a vapor deposition material, and the second substrate 21 is aligned with the first substrate.

As shown in FIG. 2, the second substrate 21 comprises a first surface 201, the first surface 201 defines a plurality of pre-vapor deposition regions 22. Each pre-vapor deposition region 22 comprises a plurality of first pre-vapor deposition sub-regions 221, a plurality of second pre-vapor deposition sub-regions 222, and a plurality of third pre-vapor deposition sub-regions 223. Each of the pre-vapor deposition region 22 comprises one first pre-vapor deposition region 221, one second pre-vapor deposition region 222, and one third pre-vapor deposition region 223 arranged in sequence. In this embodiment, the plurality of grooves 12 corresponds to the plurality of first pre-vapor deposition regions 221, the projections of the grooves 12 on the first substrate 11 overlap with the first pre-vapor deposition regions 221.

Figure 10:
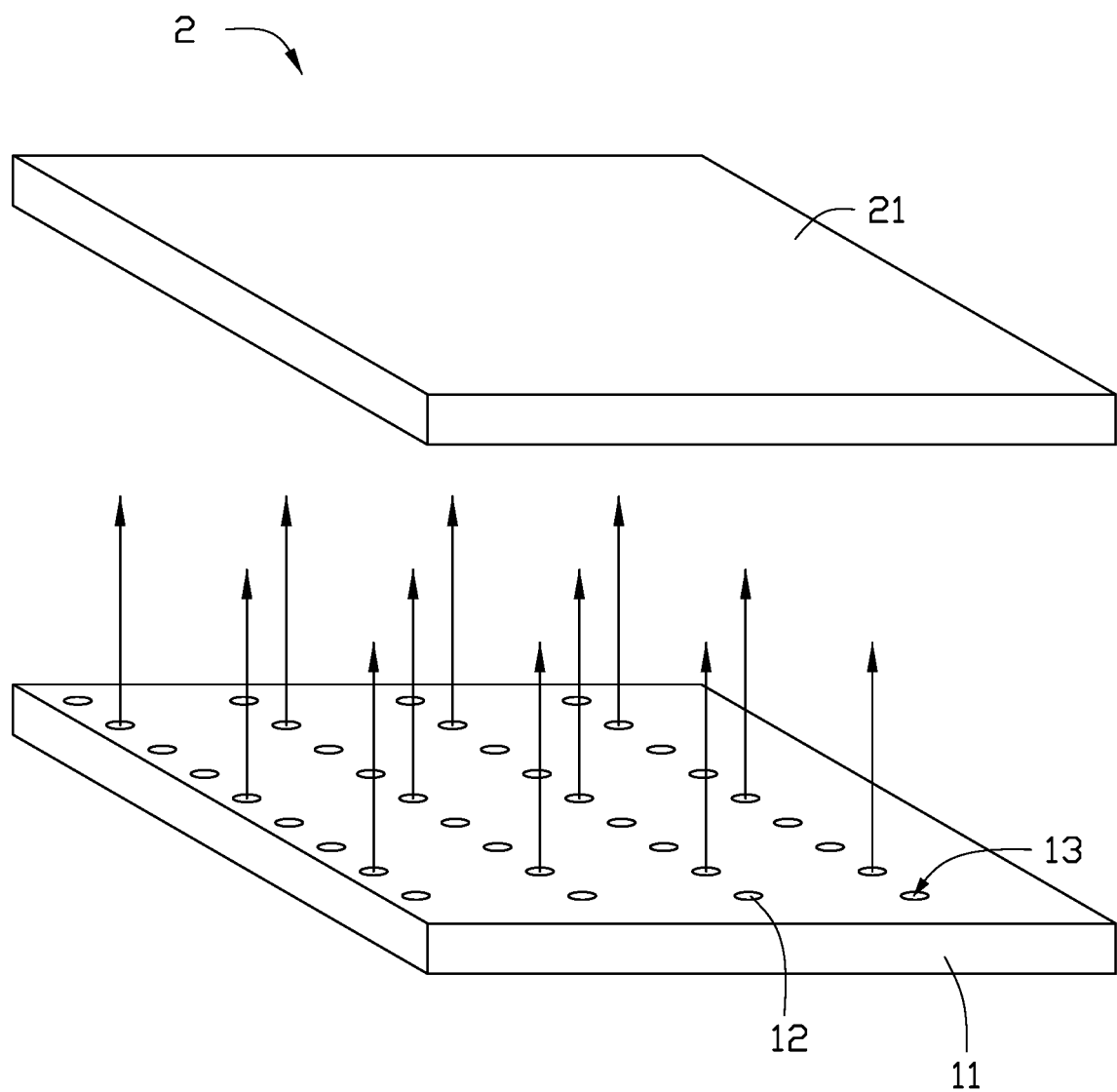

Step S604: as shown in FIG. 10, the first substrate 11 is heated to vaporize the vapor deposition material 13 (organic light-emitting material) on the pre-vapor deposition regions 22, thereby forming an organic light-emitting material layer of an OLED display panel 2.

In this embodiment, the vapor deposition material 13 in the grooves 12 is vaporized on the first pre-vapor deposition region 221 of the second substrate 21 to form an organic light-emitting layer.

It can be understood that the method of forming the organic light-emitting material layers in the second pre-vapor deposition region 222 and the third pre-vapor deposition region 223 is similar to the method of forming the organic light-emitting material layer in the first pre-vapor deposition region 221 described above.

Figure 11:
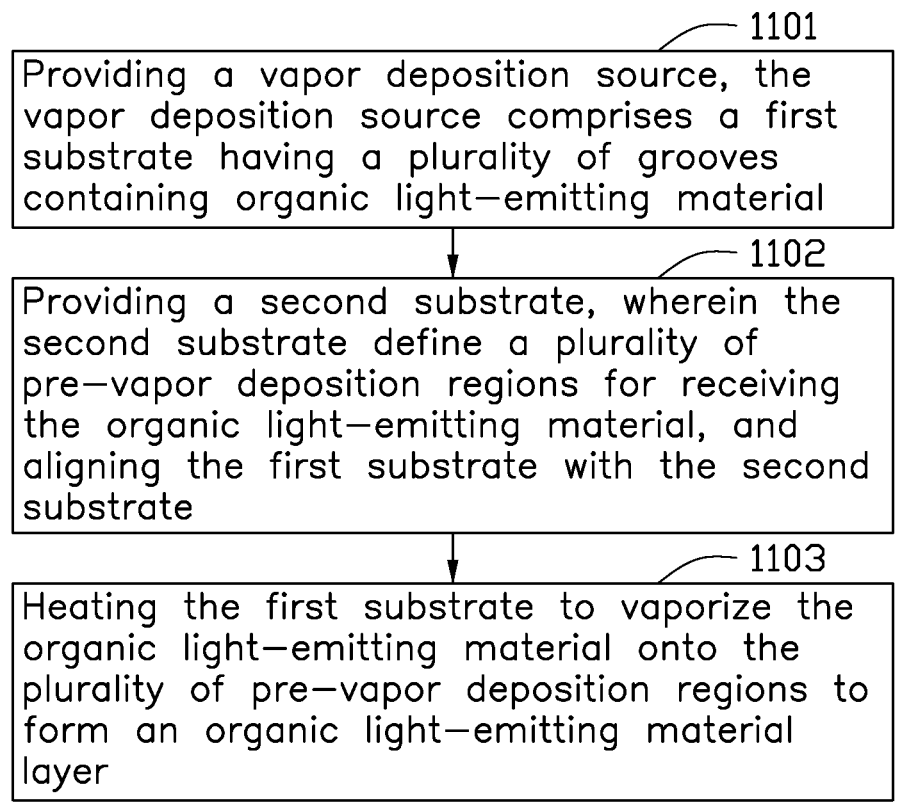
FIG. 11 is a flowchart of a method for manufacturing an OLED display panel according to another embodiment of the present disclosure.

As shown in FIG. 11, a method for manufacturing an OLED display panel according to another embodiment comprises:

Step S1101: a first substrate 11 with a plurality of grooves 12 is provided, the grooves 12 contain vapor deposition material 13.

In this embodiment, the vapor deposition material 13 is an organic light-emitting material.

Step S1102: a second substrate 21 is provided as a substrate for carrying a vapor deposition material, and the second substrate 21 is aligned with the first substrate.

Step S1103: the first substrate 11 is heated to vaporize the vapor deposition material 13 on the pre-vapor deposition regions 22, thereby forming an organic light-emitting material layer of a OLED display panel 2.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A method for making organic light emitting diode display panel, comprising:
   providing a first substrate, forming a plurality of grooves on the first substrate;
   filling the plurality of grooves with organic light-emitting material;
   providing a second substrate, wherein the second substrate defines a plurality of pre-vapor deposition regions for carrying the organic light-emitting material;
   aligning the first substrate with the second substrate; and
   heating the first substrate to vaporize the organic light-emitting material onto the plurality of pre-vapor deposition regions to form an organic light-emitting material layer of the organic light emitting diode display panel;
   wherein the method further comprises forming a peelable layer on inner surfaces of the plurality of grooves before filling the plurality of grooves with the organic light-emitting material.

2. The method of claim 1, wherein the organic light-emitting material is injected into each of the plurality of grooves.

3. The method of claim 2 further comprises:
   providing a spraying tool comprising a plurality of nozzles;
   aligning each of the plurality of nozzles with one of the plurality of grooves and injecting the organic light-emitting material into the plurality of grooves which are aligned with the plurality of nozzles.

4. The method of claim 1, wherein the peelable layer further cover a surface of the first substrate on which the plurality of grooves is formed.

5. The method of claim 1 further comprises:
   sequentially arranging one first pre-vapor deposition sub-region, one second pre-vapor deposition sub-region, and one third pre-vapor deposition sub-region in each of the plurality of pre-vapor deposition regions; and
   forming the organic light-emitting material layers of a different material on the first pre-vapor deposition sub-regions, the second pre-vapor deposition sub-regions, and the third pre-vapor deposition sub-regions.

6. The method of claim 5, wherein each of the plurality of grooves is corresponding aligned to one of the plurality of pre-vapor deposition regions.

7. The method of claim 6, wherein the first substrate is aligned with the second substrate so that a projection of each of the plurality of grooves on the first substrate overlaps with one of the plurality of pre-vapor deposition regions.

8. The method of claim 1, wherein the plurality of grooves are formed to be spaced apart from each other on the first substrate.

9. A method for making organic light emitting diode display panel, comprising:
   providing a vapor deposition source, wherein the vapor deposition source comprises a first substrate comprising a plurality of grooves containing organic light-emitting material;
   providing a second substrate, wherein the second substrate defines a plurality of pre-vapor deposition regions for carrying the organic light-emitting material;
   aligning the first substrate with the second substrate;
   heating the first substrate to vaporize the organic light-emitting material onto the plurality of pre-vapor deposition regions to form an organic light-emitting material layer of the organic light emitting diode display panel;
   wherein the method further comprises:
   providing a spraying tool comprising a plurality of nozzles;
   aligning each of the plurality of nozzles with one of the plurality of grooves and injecting the organic light-emitting material into the plurality of grooves which are aligned with the plurality of nozzles.

10. The method of claim 9, wherein the first substrate is aligned with the second substrate so that each of the plurality of grooves is correspondingly aligned to one of the plurality of pre-vapor deposition regions.

11. The method of claim 10, wherein a projection of each of the plurality of grooves on the first substrate overlaps with the corresponding one of the plurality of pre-vapor deposition regions.

12. The method of claim 9, wherein the plurality of grooves are formed to be spaced apart from each other on the first substrate.

* * * * *